United States Patent

Hayashi et al.

[11] Patent Number: 5,974,244
[45] Date of Patent: Oct. 26, 1999

[54] LAYOUT PATTERN GENERATION DEVICE FOR SEMICONDUCTOR INTEGRATED CIRCUITS AND METHOD THEREFOR

[75] Inventors: Sachio Hayashi; Reiko Nojima, both of Tokyo, Japan

[73] Assignee: Kabushiki Kaisha Toshiba, Kawasaki, Japan

[21] Appl. No.: 08/874,856

[22] Filed: Jun. 13, 1997

[30] Foreign Application Priority Data

Jun. 13, 1996 [JP] Japan ................................ 8-152363

[51] Int. Cl.$^6$ ..................................................... G06F 17/50
[52] U.S. Cl. .............................. 395/500.09; 395/500.04
[58] Field of Search .................................. 364/488–491, 364/578; 395/500.02–500.19

[56] References Cited

U.S. PATENT DOCUMENTS

| | | | |
|---|---|---|---|
| 4,827,428 | 5/1989 | Dunlop et al. | 364/491 |
| 5,493,509 | 2/1996 | Matsumoto et al. | 364/491 |
| 5,610,831 | 3/1997 | Matsumoto | 364/491 |
| 5,612,893 | 3/1997 | Hao et al. | 364/491 |
| 5,633,807 | 5/1997 | Fishburn et al. | 364/491 |
| 5,745,374 | 4/1998 | Matsumoto | 364/491 |
| 5,764,530 | 6/1998 | Yokomaku | 364/490 |
| 5,880,967 | 3/1999 | Jyu et al. | 364/489 |

OTHER PUBLICATIONS

Kishida et al., "Transistor size optimization in layout design rule", Proceedings of the IEEE Custom Integrated Circuits Conference, May 1, 1994, pp. 541–544, especially p. 542.

De Lange et al. ("A hierarchical graph oriented compaction system for symbolic layout", IEEE International Symposium on Circuits and Systems, vol. 1, pp. 57–60, May 8, 1989).

Marple et al. ("Tailor: a layout system based on trapezoidal corner stitching", IEEE Transactions on Computer–Aided Design of Integrated Circuits and Systems, vol. 9, No. 1, Jan. 1990).

Rijnders et al. ("Design of a process–tolerant cell library for regular structures using symbolic layout and hierarchical compaction", IEEE Journal of Solid–State Circuits, vol. 23, No. 3, Jun. 1998, pp. 714–721).

Lin et al. ("A circuit disassembly technique for synthesizing Symbolic layouts from mask description", IEEE Transactions on Computer–Aided design of Integrated Circuits and Systems, vol. 9, No. 9, Sep. 1990, pp. 959–969).

*Primary Examiner*—Kevin J. Teska
*Assistant Examiner*—Phallaka Kik
*Attorney, Agent, or Firm*—Foley & Lardner

[57] ABSTRACT

A layout pattern generation method and device executing this method in which a symbolic layout of a semiconductor integrated circuit is generated, the sizes of transistors are changed by using the circuit connection information of the layout pattern, the correspondence information of the transistors whose sizes have been changed are generated by using the symbolic layout and the changed circuit connection information, the symbolic layout after the transistor sizes have been changed is generated by using the correspondence information, the generated symbolic layout is compacted, and then a new layout pattern is generated by using the compacted layout pattern.

8 Claims, 11 Drawing Sheets

| | |
|---|---|
| 1001 | TR045 |
| 1002 | TR078 |
| 1003 | TR002 |
| 1004 | TR093 |
| 1005 | TR145 |
| 1006 | TR035 |

FIG.6B

| | | |
|---|---|---|
| 1001 | 2 | 8 |
| 1002 | 2 | 10 |
| 1003 | 2 | 12 |
| 1004 | 2 | 8 |
| 1005 | 2 | 20 |
| 1006 | 2 | 8 |

LAYOUT PATTERN GENERATION DEVICE FOR SEMICONDUCTOR INTEGRATED CIRCUITS AND METHOD THEREFOR

BACKGROUND OF THE INVENTION

1. Field of the Invention

The present invention relates to a layout pattern generation device for semiconductor integrated circuits and a method used by the layout pattern generation device, and more particularly, it relates to a layout pattern generation device and a method for semiconductor integrated circuits for generating a layout pattern in which transistor sizes in an existing layout pattern are changed.

2. Description of the Related Art

Figure 1A:
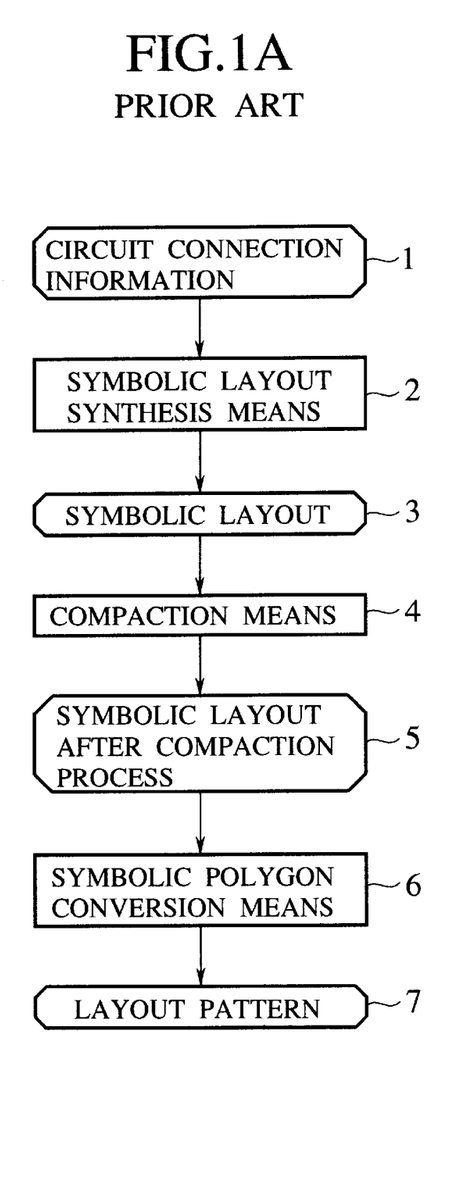
FIGS. 1A and 1B are block diagrams showing the configurations of a conventional layout pattern generation devices for semiconductor integrated circuits as CAD systems.
Figure 1B:
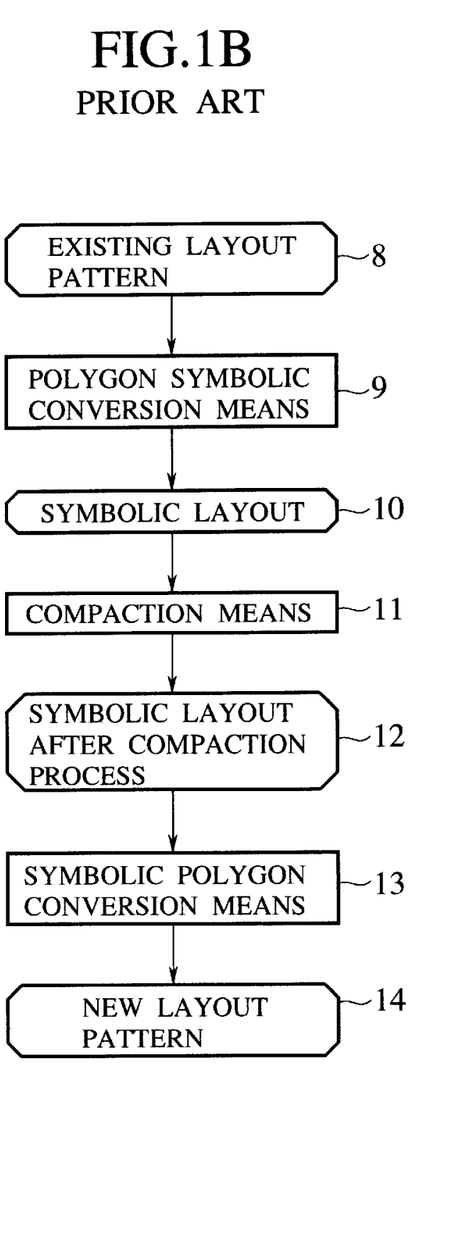

FIGS. 1A and 1B are block diagrams showing conventional computer Aided Design (CAD) systems for generating the layout pattern of a LSI (a large scale integrated circuit).

There is the "LAS" that is a product of CADENCE company as one of examples of the conventional CAD systems. This CAD system "LAS" comprises the symbolic layout synthetic means 2 and the compaction means 4 and the symbolic polygon conversion means 6, as shown in FIG. 1A.

In the conventional CAD system shown in FIG. 1A, a symbolic layout is synthesized based on the circuit connection information 1 by the symbolic layout synthesis means 2. Then, the symbolic layout 3 is compacted by the compaction means 4, the compacted symbolic layout is converted to polygon data items by the symbolic polygon conversion means 6. Thereby, the layout pattern 7 is generated.

FIG. 1B is a block diagram showing the configuration of another conventional CAD system.

The conventional CAD system shown in FIG. 1B comprises a polygon symbolic conversion means 9, a compaction means 11, and a symbolic polygon conversion means 13. In this CAD system shown in FIG. 1B, a symbolic layout 10 is generated based on an existing layout pattern 8 by the polygon symbolic conversion means 9. Then, the symbolic layout 10 is compacted by the compaction means 11, the compacted symbolic layout is converted to polygon data items by the symbolic polygon conversion means 13. Thereby, the new layout pattern 14 is generated.

Figure 2:
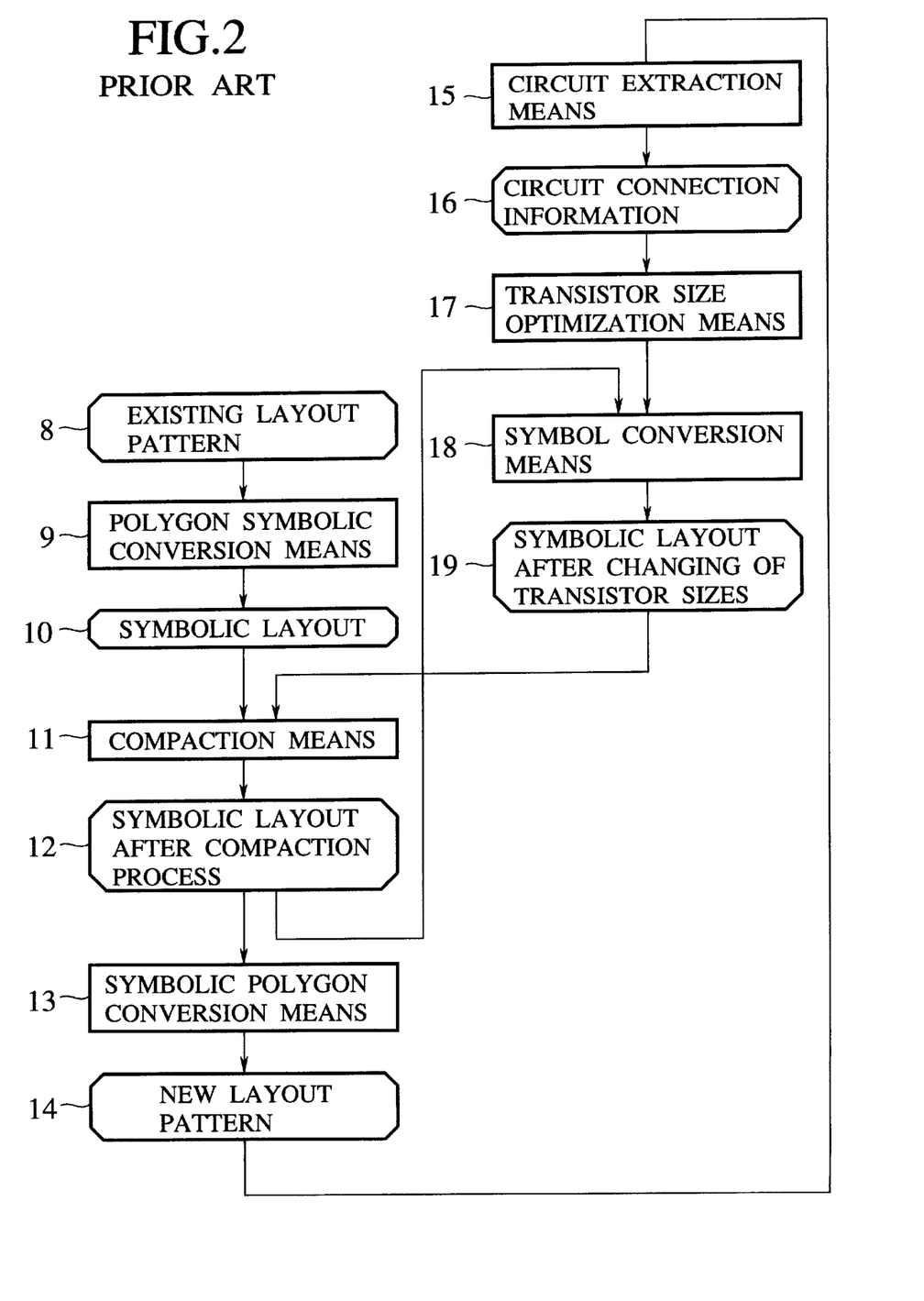
FIG. 2 is a block diagram showing the configuration of another conventional layout pattern generation device for semiconductor integrated circuits as a CAD system.

FIG. 2 is a block diagram showing a configuration of another conventional CAD system. The CAD system shown in FIG. 2 further comprises means for performing an optimization process for transistor sizes. That is, the CAD system shown in FIG. 2 has the function of the above optimization means in addition to the function of the conventional CAD system shown in FIG. 1B.

The information of the conventional CAD system shown in FIG. 2 is following: S. Kishida, et al., "Transistor Size Optimization in Layout Design Rule Migration", Proceedings of the IEEE 1994 Custom Integrated Circuits Conference, pp. 541–544).

That is, the CAD system shown in FIG. 2 comprises the circuit extraction means 15, the transistor size optimization means 17, and the symbol conversion means 18. In both the CAD systems shown in FIG. 1B and FIG. 2, the processes from the existing layout pattern process to the new layout pattern generation process are same. After these processes, in the CAD system shown in FIG. 2, data items as circuit connection information 16 are extracted from the new layout pattern 14 by the circuit extraction means 15. The transistor sizes are optimized by using the circuit connection information 16 by the transistor size optimization means 17. Then, the sizes of transistors in the compacted symbolic layout 12 are changed according to the result of the optimization process by the symbol conversion means 18. Then, the symbolic layout 19, whose transistor sizes has been changed, is compacted by the compaction means 11. The compacted symbolic layout 12 is converted to polygon data items by the symbolic polygon conversion means 13. Thereby, a new layout pattern 14 is generated.

After the new symbolic layout pattern is obtained, the circuit extraction means 15, and the symbolic polygon conversion means 13 are repeatedly processed.

In the conventional CAD system shown in FIG. 1A, it is possible to change the transistor sizes based on the circuit connection information and to apply the changed transistor sizes to the layout pattern. Thereby, it can be easily performed to change the layout pattern. However, there is a problem that it is impossible to generate a new layout pattern by using any existing layout pattern because this conventional CAD system shown in FIG. 1A generates a new layout pattern only by using the circuit connection information.

In the conventional CAD system shown in FIG. 1B, although it is possible to generate a new layout pattern, in which transistor sizes in an existing layout pattern have been changed, by changing parameters of the transistor symbols in symbolic data items, it must require many times to perform the new layout pattern generation process when the number of data items are large. In this case, if the transistor size changing operation is performed for the circuit connection information and this operation result can be reflected to or used for the layout pattern, the new layout pattern generation process can be executed efficiently. However, it is difficult in configuration and function to execute the above processes by the conventional CAD system.

As described above, it is impossible to change the transistor sizes in the conventional CAD systems without a hand process. That is, it is difficult to optimize the transistor sizes in the layout pattern by using the conventional CAD systems.

On the other hand, the conventional CAD system shown in FIG. 2 includes the function of the transistor size optimization process in addition to the function of the conventional CAD system shown in FIG. 1B. Therefore, the transistor size optimization process can be executed by the CAD system shown in FIG. 2. However, the conventional CAD system shown in FIG. 2 can execute the transistor size optimization process only by using a layout pattern in which the compaction process has already been completed. Therefore it must require many times to execute the transistor size optimization process. In addition to this drawback, there is the drawback that a compaction ratio or a compaction effect based on the changing of the transistor sizes becomes bad after the layout pattern is compacted one time.

When the transistor size changing process is executed by a hand processing in the conventional CAD system, the symbolic data items or the circuit connection information extracted from the layout pattern are used. Accordingly, when the number of data items are large, it becomes impossible to perform the transistor size changing process using the symbolic data items. Furthermore, it is difficult to use the circuit connection information extracted from the layout pattern by a hand processing.

SUMMARY OF THE INVENTION

Accordingly, an object of the present invention is, with due consideration to the drawbacks of the conventional CAD systems as the conventional layout pattern generation devices, to provide a layout pattern generation device for semiconductor integrated circuits that is capable of increasing the process efficiency for designing semiconductor integrated circuits. The layout pattern generation device of the present invention can changes transistor sizes in an existing layout pattern of a semiconductor integrated circuit based on circuit connection information, and generates a new layout pattern. In the layout pattern generation device of the present invention can change the sizes of transistors in the existing layout pattern before a compaction process. This causes to increase the efficiency of the compaction process.

In accordance with one aspect of the present invention, a layout pattern generation device for generating a new layout pattern of a semiconductor integrated circuit by changing transistor sizes of transistors in an existing layout pattern, comprises polygon symbolic conversion means for converting a layout pattern of the semiconductor integrated circuit to a symbolic layout; transistor size change means for changing a transistor size of each transistor in circuit connection information of the layout pattern; correspondence information generation means for generating correspondence information of the transistors in the symbolic layout and the sizes of the transistors whose sizes being changed by using the symbolic layout converted by the polygon symbolic conversion means and the circuit connection information changed by the transistor size change means; symbol conversion means for converting the transistor symbols in the symbolic layout according to the correspondence information; compaction means for compacting the symbolic layout converted by the symbol conversion means; and symbolic polygon conversion means for generating a new layout pattern of the semiconductor integrated circuit by using the compacted symbolic layout.

In the layout pattern generation device for generating a new layout pattern of a semiconductor integrated circuit described above, the transistor size change means executes an optimization of transistor sizes.

In the layout pattern generation device for generating a new layout pattern of a semiconductor integrated circuit described above, the correspondence information generation means comprises agreement information making means and correspondence information making means, wherein the agreement information making means inputs the symbolic layout converted by the polygon symbolic conversion means and the circuit connection information changed by the transistor size change means, for making transistor agreement information of the transistors in the symbolic layout and the transistors in the changed circuit connection information, and the correspondence information making means makes correspondence information of the transistor sizes in the symbolic layout and the transistor sizes in the changed circuit connection information by using the transistor agreement information.

In the layout pattern generation device for generating a new layout pattern of a semiconductor integrated circuit described above, the agreement information making means compares the symbolic layout converted by the polygon symbolic conversion means with the circuit connection information changed by the transistor size change means, makes the agreement information of the transistor in the symbolic layout and the transistors in the circuit connection information in which the transistor sizes are changed, the correspondence information making means making the correspondence information of the transistors in the symbolic layout and the sizes of the transistors whose sizes are changed by using the transistor agreement information made by the agreement information making means.

In accordance with further aspect of the present invention, a layout pattern generation device for generating a new layout pattern of a semiconductor integrated circuit by changing transistor sizes of transistors in an existing layout pattern, comprises: polygon symbolic conversion means for converting a layout pattern of the semiconductor integrated circuit to a symbolic layout; transistor size optimization means for optimizing transistor sizes of transistors in circuit connection information of the layout pattern; correspondence information generation means for generating correspondence information of the transistors in the symbolic layout and the sizes of the transistors whose sizes being changed by using the symbolic layout converted by the polygon symbolic conversion means and the circuit connection information optimized by the transistor size optimization means; symbol conversion means for converting the transistor symbols in the symbolic layout according to the correspondence information; compaction means for compacting the symbolic layout converted by the symbol conversion means; symbolic polygon conversion means for generating a new layout pattern of the semiconductor integrated circuit by using the compacted symbolic layout; and circuit extraction means for extracting circuit connection information by using the layout pattern changed by the symbolic polygon conversion means. In the layout pattern generation device, the transistor size optimization means optimizes the transistor sizes by using the circuit connection information extracted by the circuit extraction means, the symbol conversion means converts the symbol of the symbolic layout compacted by the compaction means in order to generate the new layout pattern of the semiconductor integrated circuit.

In accordance with further aspect of the present invention, a layout pattern generation method of generating a new layout pattern of a semiconductor integrated circuit by changing transistor sizes of transistors in an existing layout pattern, comprises the steps of: a symbolic layout generation step for generating a symbolic layout by using the existing layout pattern of the semiconductor integrated circuit; a transistor size change step for changing a transistor size of each transistor in circuit connection information of the layout pattern; a correspondence information generation step for generating correspondence information of the transistors in the symbolic layout and the sizes of the transistors whose sizes being changed by using the symbolic layout generated in the symbolic layout generation step and the circuit connection information changed in the transistor size change step; a symbol conversion step for converting the transistor symbols in the symbolic layout according to the correspondence information; a compaction step for compacting the symbolic layout converted in the symbol conversion step; and a new layout pattern generation step for generating a new layout pattern of the semiconductor integrated circuit by using the compacted symbolic layout.

In accordance with further aspect of the present invention, a layout pattern generation method of generating a new layout pattern of a semiconductor integrated circuit by changing transistor sizes of transistors in an existing layout pattern, comprises the steps of: a symbolic layout generation step for generating a symbolic layout by using the existing layout pattern of the semiconductor integrated circuit; a transistor size optimization step for optimizing a transistor size of each transistor in circuit connection information of the layout pattern; a correspondence information generation step for generating correspondence information of the transistors in the symbolic layout and the sizes of the transistors whose sizes being changed by using the symbolic layout generated in the symbolic layout generation step and the circuit connection information optimized in the transistor size optimization step; a symbol conversion step for converting the transistor symbols in the symbolic layout according to the correspondence information; a compaction step for compacting the symbolic layout converted in the symbol conversion step; a new layout pattern generation step for generating a new layout pattern of the semiconductor integrated circuit by using the compacted symbolic layout; an evaluation step for evaluating whether or not the new layout pattern generated in the new layout pattern generation step satisfies predetermined conditions; and a circuit extraction step for extracting circuit connection information of the new layout pattern when the new layout pattern does not satisfy the predetermined conditions. In the layout pattern generation method, the transistor size optimization step optimizes the transistor sizes by using the circuit connection information extracted in the circuit extraction step, the symbol conversion step converts the symbol of the symbolic layout compacted in the compaction step in order to generate the new layout pattern of the semiconductor integrated circuit.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a layout pattern generation device and method according to the present invention will now be described with reference to the drawings. Basic configuration of the design system.

Figure 3A:
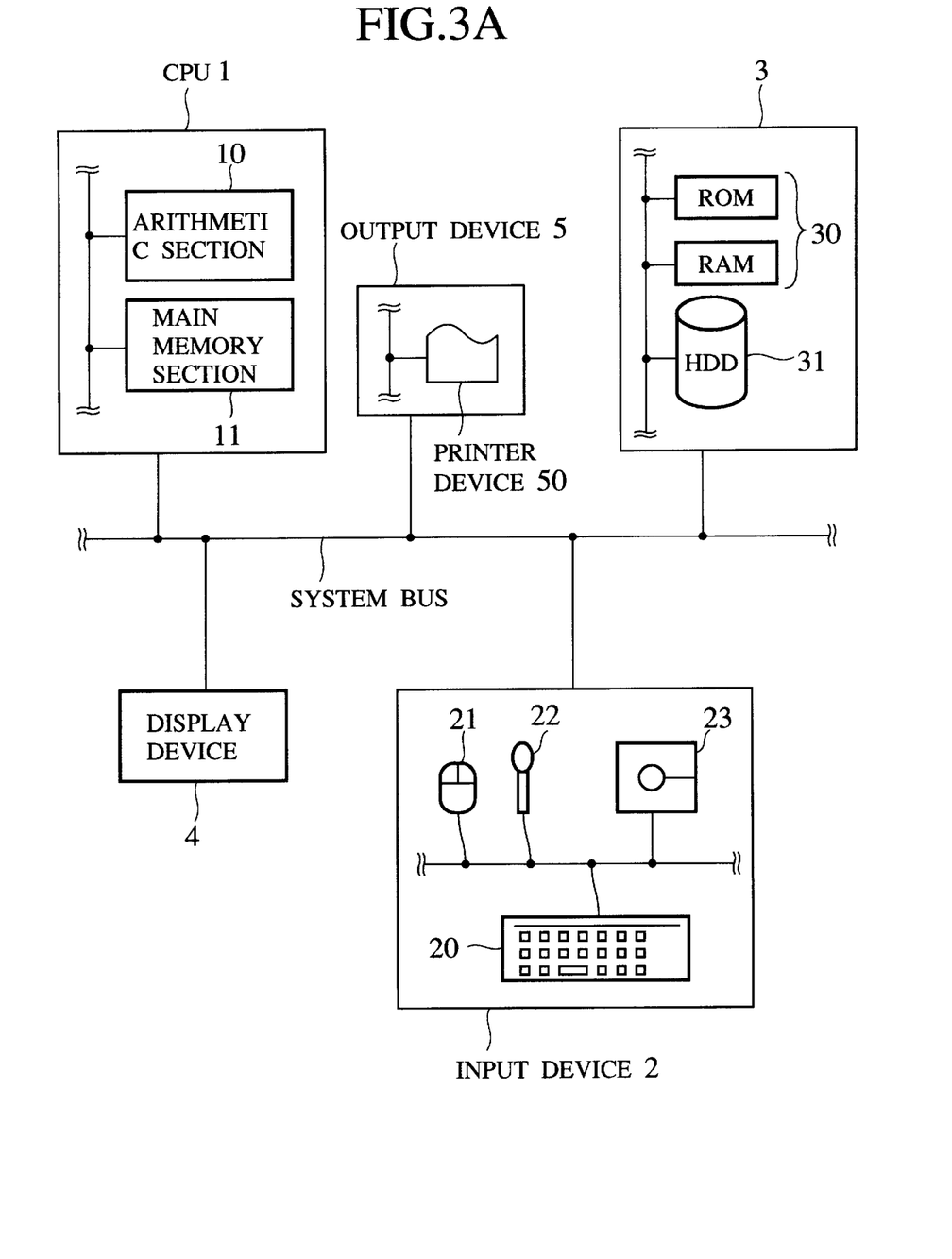
FIG. 3A is a block diagram showing the configuration of a design system of the present invention incorporating a layout pattern generation device for semiconductor integrated circuits according to the first embodiment of the present invention.

FIG. 3A is a block diagram showing a design system for executing a layout pattern generation method for semiconductor integrated circuits according to the present invention. The design system includes the layout pattern generation device for executing the layout pattern generation method and the design system of the present invention comprises a central processing unit (CPU) 1 for performing various processes, input device 2 including a key board 20, a mouse 21, a light pen 22, and a flexible disk device 23 and the like, an external memory device 3 such as a hard disk device 31, a memory device 30 such as a read only memory (ROM), a random access memory (RAM) and the like, and an output device 5 such as a display device 4, a printer device 50 and the like. The CPU 1 comprises an arithmetic section for performing each step and a main memory section 11 for storing instructions of each of the steps which will be described.

Specifically, each means forming the design system of the present invention shown in FIG. 2A will be defined in claims and also be explained in detail in the following preferred embodiments. These means are included in the external memory device such as the ROM, RAM 30, or Hard Disk device 31 by a software, for example. When the design method is executed by the design system of the present invention, the software is transferred to main memory 11 to execute the software. But, the present invention is not limited by this configuration, for example, these means can be formed by a hardware and a software.

First embodiment

Figure 3B:
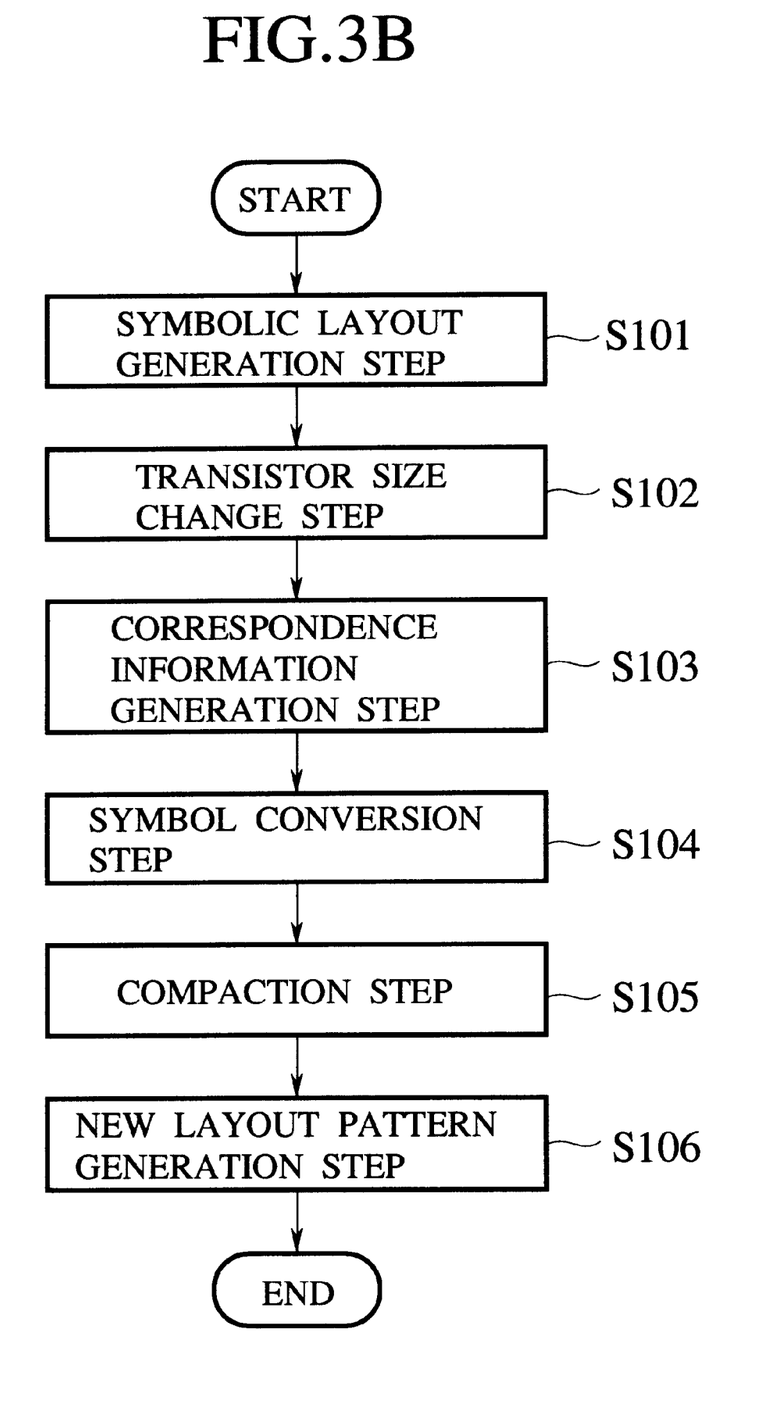
FIG. 3B is a flow chart showing a layout pattern generation method for semiconductor integrated circuits according to the first embodiment of the present invention.

FIG. 3B is a flow chart showing a layout pattern generation method for semiconductor integrated circuits according to the first embodiment of the present invention.

The layout pattern generation method for semiconductor integrated circuits according to the first embodiment comprises a symbolic layout generation step S101 for generating a symbolic layout by using a layout pattern of a semiconductor integrated circuit, a transistor size change step S102 for changing the size of each transistor in a circuit connection information of the layout pattern, a correspondence information generation step for generating a correspondence information, generated based on the symbolic layout generated by the symbolic layout generation step S101 and the circuit connection information changed by the transistor size change step S102, in which each transistor in the symbolic layout and a changed size data item of each transistor is included, a symbol conversion step S104 for changing the transistor symbol in the symbolic layout based on the correspondence information, a compaction step S105 for performing a compaction process for compacting the generated symbolic layout, and a new layout pattern generation step S106 for generating a new layout pattern based on the compacted symbolic layout.

Figure 4:
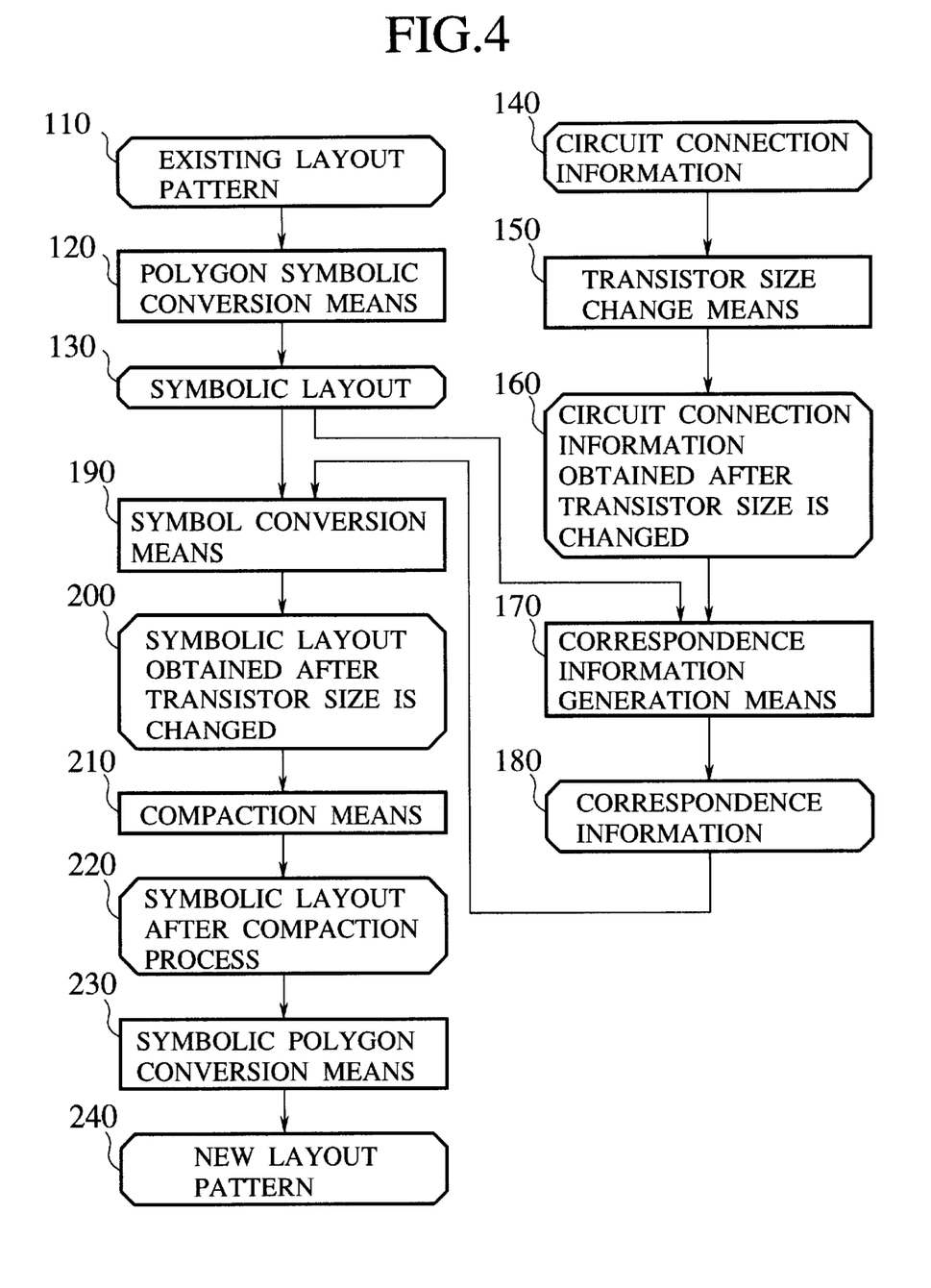
FIG. 4 is a block diagram showing the configuration of a layout pattern generation device for semiconductor integrated circuits according to the first embodiment of the present invention.

FIG. 4 is a block diagram showing the configuration of the layout pattern generation device for semiconductor integrated circuits according to the first embodiment of the present invention. This layout pattern generation device executes the layout pattern generation method shown in FIG. 3.

The layout pattern generation device of the first embodiment shown in FIG. 4 comprises a polygon symbolic conversion means 120, a transistor size change means 150, a correspondence information generation means 170, a symbol conversion means 190, a compaction means 210, and a symbolic polygon conversion means 230.

In the layout pattern generation device of the first embodiment, at first, the polygon symbolic conversion means generates the symbolic layout 130 by using an existing layout pattern of a semiconductor integrated circuit. Next, the transistor size change means 150 changes the transistor size of each transistor in circuit connection information 140 corresponding to the existing layout pattern 110 and generates the circuit connection information 160 obtained after the transistor sizes have been changed. Here, the circuit connection information 140 is equal to a SPICE net list and the like, for example. In addition to this, the transistor size change means 150 is a schematic editor for editing a schematic data items, or a text editor for editing the SPICE net list. Operators or designers can use the above editors in order to change the transistor size.

Next, the correspondence information generation means 170 generates the correspondence information 180 based on the above symbolic layout 130 and the circuit connection information 160 obtained after the transistor size is changed.

Figure 5:
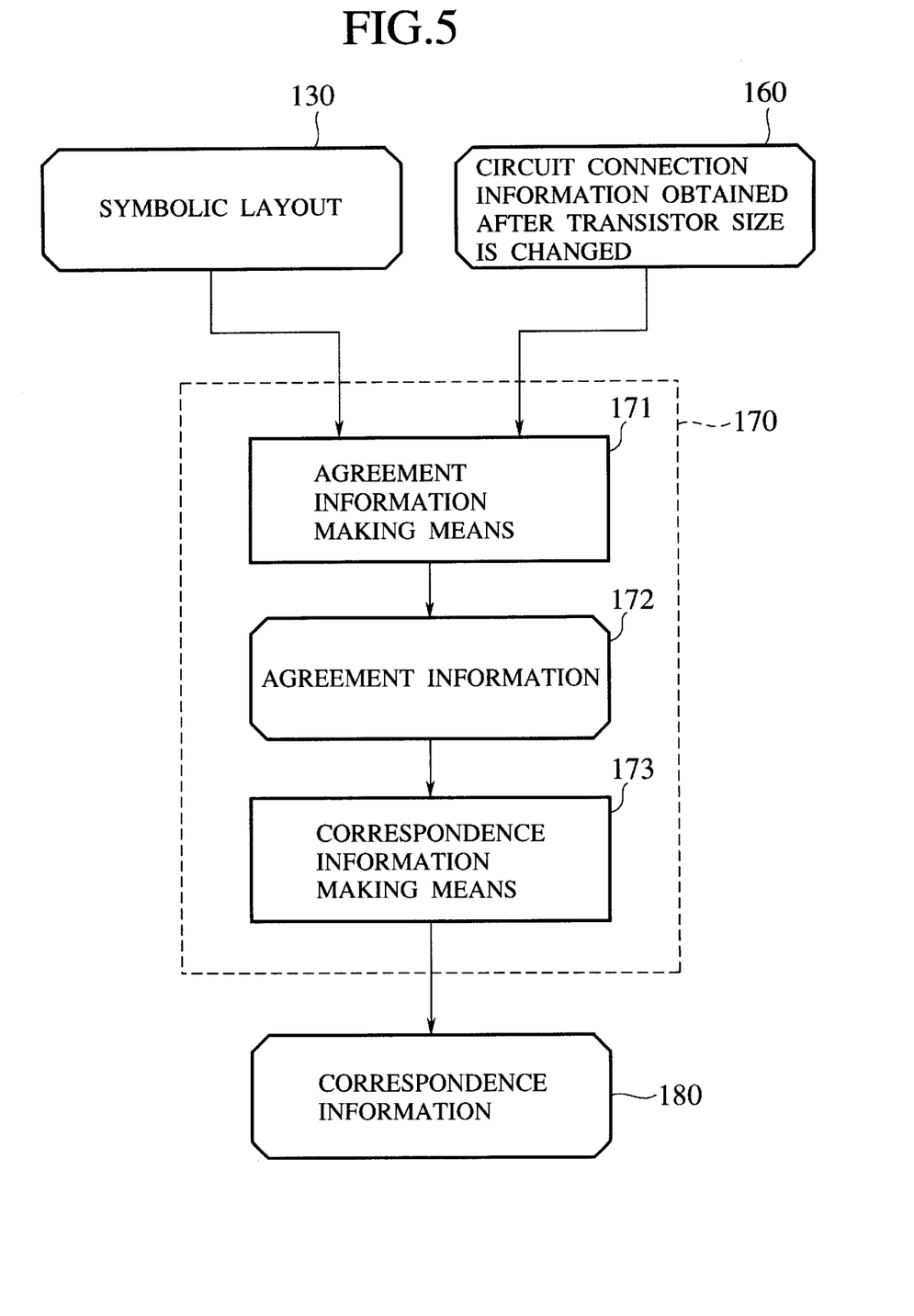
FIG. 5 is a block diagram showing the configuration of a correspondence information generation means incorporated in the layout pattern generation device of the first embodiment shown in FIG. 4.

FIG. 5 is a block diagram showing the configuration of the correspondence information generation means 170 incorporated in the layout pattern generation device of the first embodiment shown in FIG. 4.

The correspondence information generation means 170 comprises an agreement information making means 171 and a correspondence information making means 173. The agreement information making means 171 receives the symbolic layout 130 and the circuit connection information 160 obtained after the transistor sizes are changed, and then makes the agreement information of transistors in the symbolic layout 130 and the transistors having the changed sizes in the circuit connection information 160. The correspondence information making means 173 generates the correspondence information of the transistors in the symbolic layout and the changed sizes of the transistors based on the agreement information made by the agreement information making means 171.

The agreement information generation means 171 compares the symbolic layout 130 with the circuit connection information 160 obtained after the transistor sizes are changed and generates the transistor agreement information 172 of them.

Figure 6A:
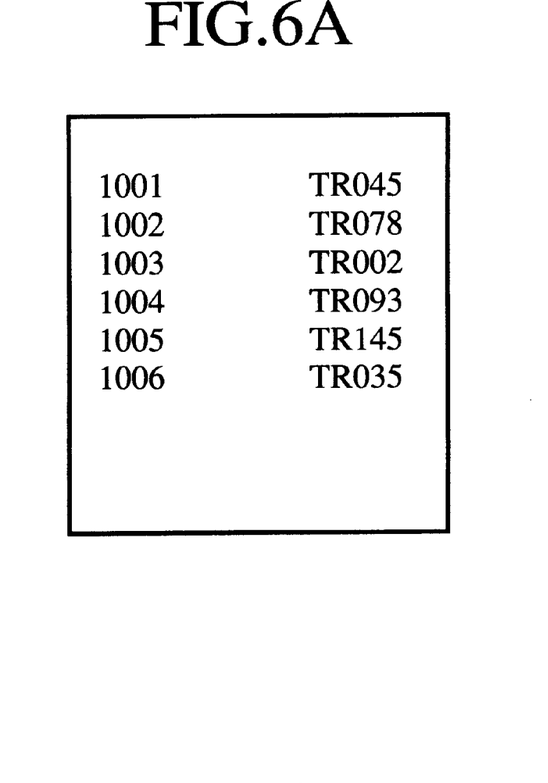
FIGS. 6A and 6B are diagrams showing examples of agreement information and correspondence information.
Figure 6B:
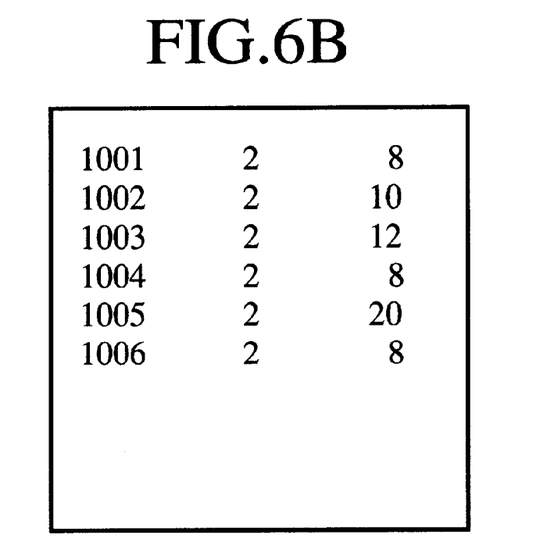

FIGS. 6A and 6B are diagrams showing examples of the agreement information and the correspondence information. As shown in FIG. 6A, transistor symbol designation signs are described in the first column. A transistor designation sign in the circuit connection information 160 corresponding to each transistor symbol after its transistor size is changed is also described next to each of the transistor symbol designation sign in the second column. The agreement relationship between the transistor in the symbolic layout and the transistor in the circuit connection information 160 obtained after the transistor size is changed can be obtained by using the agreement information 172.

Because the transistor designation sign in the circuit connection information 160, obtained after the transistor size is changed, corresponding to each transistor symbol in the symbolic layout 130 is obtained by using the transistor agreement information 172, the correspondence information can be obtained by searching the channel length and the channel wide of each transistor whose size is changed corresponding to the designation sign based on the circuit connection information 160 obtained after the transistor size is changed. Thereby, the correspondence information 180 in which the designation sign of each transistor symbol in the symbolic layout corresponds to the channel length and the channel wide of its transistor symbol obtained after the transistor size is changed can be generated.

This correspondence information 180 is shown in FIG. 6B. In FIG. 6B, the transistor symbol designation signs are described in the first column. The channel length and the channel wide of the transistor symbol obtained after the transistor size is changed in the column next to the first column.

The size of the transistor symbol in the symbolic layout 130 is changed based on the symbol conversion means 190 based on the correspondence information 180. The compaction means 210 performs the compaction process for the symbolic layout 200 obtained after the transistor size is changed. Then, the symbolic polygon conversion means 230 converts the symbolic layout 220 obtained by the compaction process to a new layout pattern 240.

As described above, according to the layout pattern generation method and device as the first embodiment of the present invention, the symbolic layout, whose transistor sizes have been changed, extracted from the existing layout pattern is compacted and then the new layout pattern is generated. Thereby, the generation process for generating a new layout pattern in which transistor sizes of transistors in an existing layout pattern are changed can be executed efficiently by using the existing layout pattern.

Second embodiment

Figure 7:
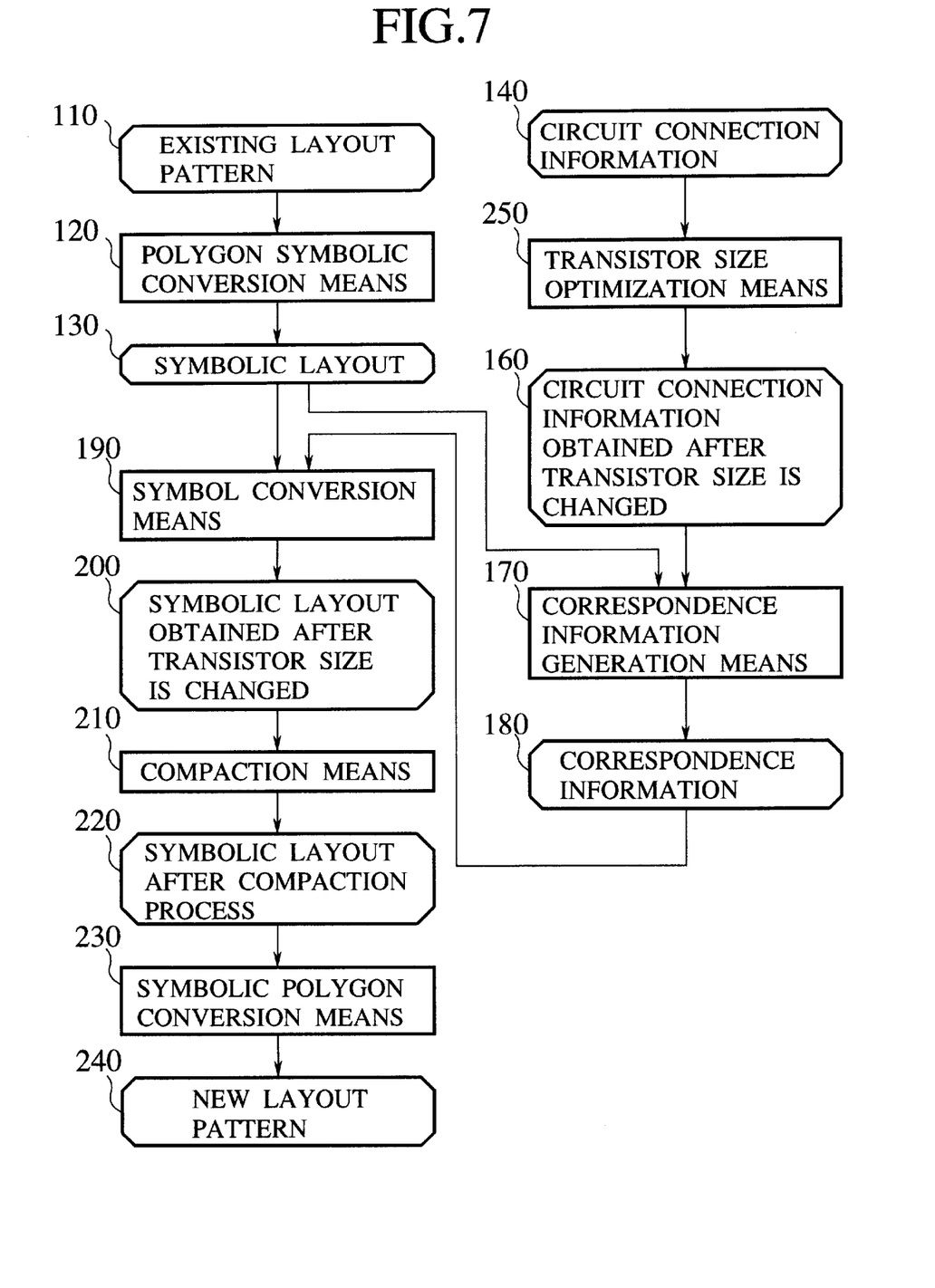
FIG. 7 is a block diagram showing the configuration of a layout pattern generation device for semiconductor integrated circuits according to the second embodiment of the present invention.

FIG. 7 is a block diagram showing the configuration of the layout pattern generation device for semiconductor integrated circuits according to the second embodiment of the present invention.

The layout pattern generation device of the second embodiment has the configuration in which a transistor size optimization means 250 is incorporated instead of the transistor size change means 150 in the layout pattern generation device of the first embodiment. By using the transistor size optimization means 250, it is possible to generate circuit connection information 180 in which the size of each transistor has been optimized in consideration of its operation timing and its power consumption. Other components of the layout pattern generation device of the second embodiment are same as those of the layout pattern generation device of the first embodiment. Therefore the explanation of the same components is omitted here.

Figure 8:
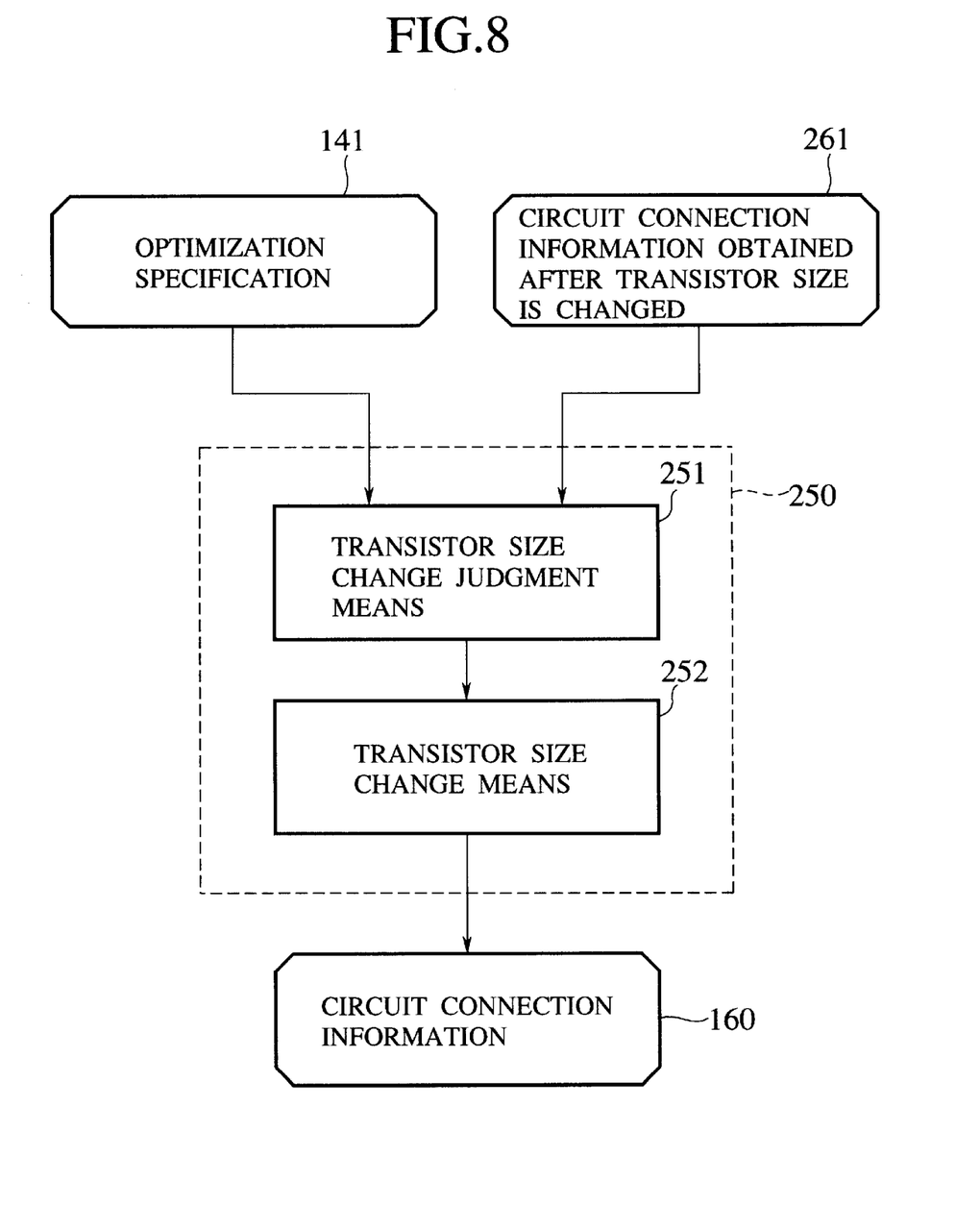
FIG. 8 is a block diagram showing a concrete configuration of a transistor size optimization means incorporated in the layout pattern generation device of the second embodiment shown in FIG. 7.

FIG. 8 is a block diagram showing a concrete configuration of a transistor size optimization means incorporated in the layout pattern generation device of the second embodiment shown in FIG. 7.

The transistor size optimization means 250 comprises a transistor size change judgment means 251 and a transistor size change means 252. The transistor size change judgment means 251 inputs an optimization specification 141 and a circuit connection information 261 and then judges whether or not the transistor size will be changed and the most suitable size of this transistor. The transistor size change means 252 receives the result of the judgment operation executed by the transistor size change judgment means 151, changes this transistor size according to the result, and outputs the circuit connection information 160 obtained after the transistor size is changed. In this case, the transistor size change judgment means 251 uses well-known technical information in order to judge the most suitable optimization.

As described above, according to the second embodiment, the layout pattern generation device has the configuration shown in FIG. 8. Therefore it is possible to execute the transistor size optimization process before the compaction process. Thereby, it is possible to increase the degree of freedom for the transistor size optimization and to execute efficiently the compaction process when the layout pattern generation device and method of the second embodiment is compared with the conventional layout pattern device and method where the transistor size optimization process is executed after the compaction process.

Third embodiment

Figure 9:
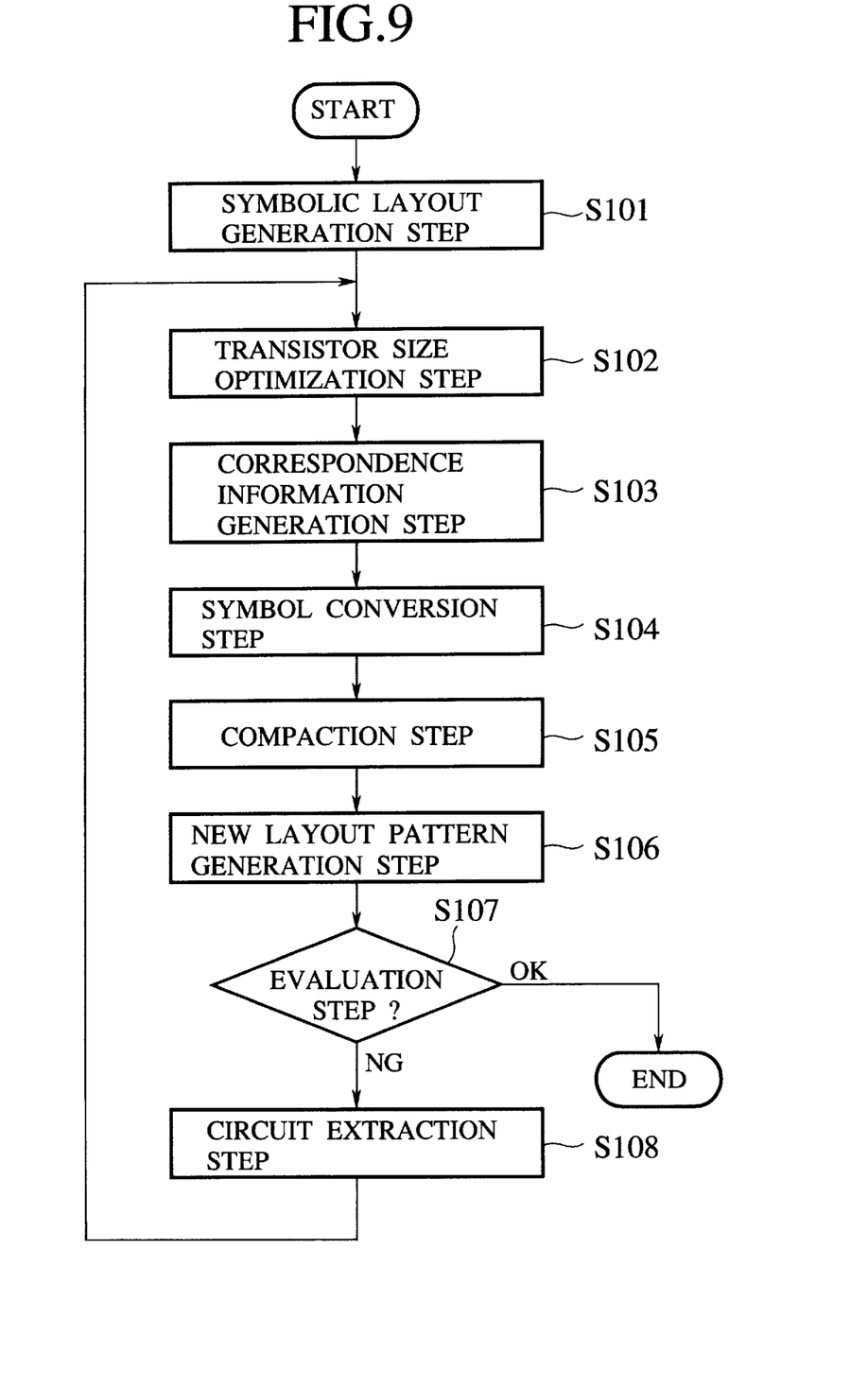
FIG. 9 is a flow chart showing a layout pattern generation method for semiconductor integrated circuits according to the third embodiment of the present invention.

FIG. 9 is a flow chart showing a layout pattern generation method for semiconductor integrated circuits according to the third embodiment of the present invention.

The layout pattern generation method of the third embodiment comprises a symbolic layout generation step S101, a transistor size optimization step S102, a correspondence information generation step S103, a symbol conversion step S104, a compaction step S105, a new layout pattern generation step S106, an evaluation step S107, and a circuit extraction step S108. The symbolic layout generation step S101 generates a symbolic layout by using the layout pattern of a semiconductor integrated circuit. The transistor size optimization step S102 performs a transistor size optimization step to optimize the transistor sizes for the circuit connection information of the layout pattern of the semiconductor integrated circuit. The correspondence information generation step S103 generates the correspondence information of the transistors in the symbolic layout and the transistor sizes obtained after the transistor sizes are changed based on the symbolic layout converted by the symbolic layout generation step S101 and the circuit connection information which are optimized by the transistor size optimization step S102. The symbol conversion step S104 converts the transistor symbols in the symbolic layout based on the correspondence information. The compaction step S105 compacts this symbolic layout generated by the symbol conversion step S104. The new layout pattern generation step S106 generates a new layout pattern of the semiconductor integrated circuit by using the compacted layout pattern. The evaluation step S107 evaluates the new layout pattern generated by the new layout pattern generation step S106. The circuit extraction step S108 extracts the circuit connection information of the new layout pattern when the new layout pattern does not satisfy a predetermined condition in the evaluation step S107.

Thus, in the layout pattern generation method of the third embodiment, the transistor size optimization step S102 optimizes the transistor sizes by using the circuit connection information extracted by the circuit extraction step S108. The symbol conversion step S104 executes the symbolic conversion for the symbolic layout obtained by the compaction process executed in the compaction step S105. After these processes, the new layout pattern of the semiconductor integrated circuit is generated.

Figure 10:
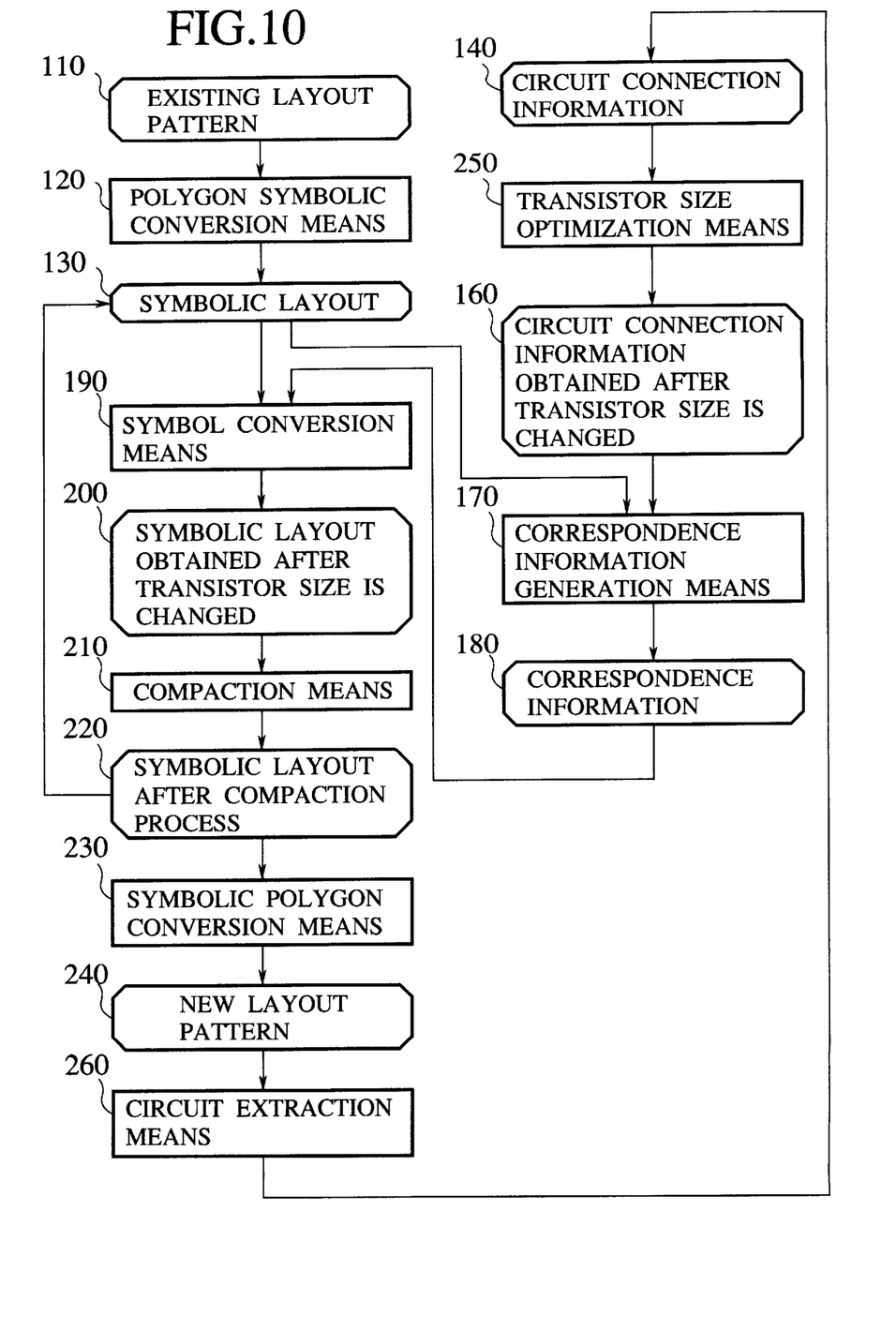
FIG. 10 is a block diagram showing the configuration of a layout pattern generation device for semiconductor integrated circuits according to the third embodiment of the present invention.

FIG. 10 is a block diagram showing the configuration of the layout pattern generation device for semiconductor integrated circuits according to the third embodiment of the present invention.

The layout pattern generation device for semiconductor integrated circuits as the third embodiment has the configuration in which a circuit extraction means 260 is incorporated in addition to the configuration of the layout pattern generation device of the second embodiment.

In the third embodiment, the processes until the new layout pattern 240 is generated are same as those of the layout pattern generation device of the second embodiment shown in FIG. 7.

In the layout pattern generation device for semiconductor integrated circuits as the third embodiment, the circuit extraction means 260 extracts the circuit connection information from the new layout pattern 240 of a semiconductor integrated circuit. This extracted circuit connection information is replaced with the circuit connection information 140. After this process, the transistor size optimization means 250 performs the optimization process by using the replaced circuit connection information.

On the other hand, like the processes described above, the symbolic layout 220 after the compaction process is replaced with the symbolic layout 130 before the compaction process. Then, the correspondence information generation means 170 generates the correspondence information by using the symbolic layout after the compaction process and the circuit connection information 160 obtained after the transistor sizes are changed after the optimization process has been executed for the extracted circuit connection information. Here, the symbol conversion means 190 performs the symbol conversion process by using the generated correspondence information 180 and the symbolic layout 130. Following processes are same as those of the layout pattern generation device of the second embodiment. These processes are repeated until a satisfied new layout pattern is generated.

According to the layout pattern generation device of the third embodiment, it is possible to generate a new layout pattern of a semiconductor integrated circuit having highly quality in a circuit configuration by repeating the transistor size optimization process by using an existing layout pattern.

As described above, in the third embodiment, the result of the transistor size change process executed by using an existing layout pattern is reflected to the symbolic layout generated by the existing layout pattern based on the correspondence information and the symbolic layout is compacted in order to generate a new layout pattern. Thereby, it is possible to increase the operation efficiency of the layout pattern generation process because the transistor size change process can be executed by using the circuit connection information in order to generate the new layout pattern of the semiconductor integrated circuit in which the transistor sizes are changed.

As described above in detail, it is possible to increase the design process efficiency for semiconductor integrated circuits by using the layout pattern generation method and the layout pattern generation device according to the present invention.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A layout pattern generation device for generating a new layout pattern of a semiconductor integrated circuit by changing transistor sizes of transistors in an existing layout pattern, comprising:

polygon symbolic conversion means for converting a layout pattern of the semiconductor integrated circuit to a symbolic layout;

transistor size change means for changing a transistor size of each transistor in circuit connection information of the layout pattern;

correspondence information generation means for generating correspondence information of the transistors in the symbolic layout and the sizes of the transistors whose sizes being changed by using the symbolic layout converted by the polygon symbolic conversion means and the circuit connection information changed by the transistor size change means;

symbol conversion means for converting the transistor symbols in the symbolic layout according to the correspondence information;

compaction means for compacting the symbolic layout converted by the symbol conversion means; and symbolic polygon conversion means for generating a new layout pattern of the semiconductor integrated circuit by using the compacted symbolic layout.

2. A layout pattern generation device for generating a new layout pattern of a semiconductor integrated circuit as claimed in claim 1, wherein the transistor size change means executes an optimization of transistor sizes.

3. A layout pattern generation device for generating a new layout pattern of a semiconductor integrated circuit as claimed in claim 1, wherein the correspondence information generation means comprises agreement information making means and correspondence information making means, wherein the agreement information making means inputs the symbolic layout converted by the polygon symbolic conversion means and the circuit connection information changed by the transistor size change means, for making transistor agreement information of the transistors in the symbolic layout and the transistors in the changed circuit connection information, and the correspondence information making means makes correspondence information of the transistor sizes in the symbolic layout and the transistor sizes in the changed circuit connection information by using the transistor agreement information.

4. A layout pattern generation device for generating a new layout pattern of a semiconductor integrated circuit as claimed in claim 3, wherein the agreement information making means compares the symbolic layout converted by the polygon symbolic conversion means with the circuit connection information changed by the transistor size change means, makes the agreement information of the transistor in the symbolic layout and the transistors in the circuit connection information in which the transistor sizes are changed, the correspondence information making means makes the correspondence information of the transistors in the symbolic layout and the sizes of the transistors whose sizes are changed by using the transistor agreement information made by the agreement information making means.

5. A layout pattern generation device for generating a new layout pattern of a semiconductor integrated circuit by changing transistor sizes of transistors in an existing layout pattern, comprising:

polygon symbolic conversion means for converting a layout pattern of the semiconductor integrated circuit to a symbolic layout;

transistor size optimization means for optimizing transistor sizes of transistors in circuit connection information of the layout pattern;

correspondence information generation means for generating correspondence information of the transistors in the symbolic layout and the sizes of the transistors whose sizes being changed by using the symbolic layout converted by the polygon symbolic conversion means and the circuit connection information optimized by the transistor size optimization means;

symbol conversion means for converting the transistor symbols in the symbolic layout according to the correspondence information;

compaction means for compacting the symbolic layout converted by the symbol conversion means;

symbolic polygon conversion means for generating a new layout pattern of the semiconductor integrated circuit by using the compacted symbolic layout; and circuit extraction means for extracting circuit connection information by using the layout pattern changed by the symbolic polygon conversion means, wherein the transistor size optimization means optimizes the transistor sizes by using the circuit connection information extracted by the circuit extraction means, the symbol conversion means converts the symbol of the symbolic layout compacted by the compaction means in order to generate the new layout pattern of the semiconductor integrated circuit.

6. A layout pattern generation method of generating a new layout pattern of a semiconductor integrated circuit by changing transistor sizes of transistors in an existing layout pattern, comprising the steps of:

a symbolic layout generation step for generating a symbolic layout by using the existing layout pattern of the semiconductor integrated circuit;

a transistor size change step for changing a transistor size of each transistor in circuit connection information of the layout pattern;

a correspondence information generation step for generating correspondence information of the transistors in the symbolic layout and the sizes of the transistors whose sizes being changed by using the symbolic layout generated in the symbolic layout generation step and the circuit connection information changed in the transistor size change step;

a symbol conversion step for converting the transistor symbols in the symbolic layout according to the correspondence information;

a compaction step for compacting the symbolic layout converted in the symbol conversion step; and a new layout pattern generation step for generating a new layout pattern of the semiconductor integrated circuit by using the compacted symbolic layout.

7. A layout pattern generation method of generating a new layout pattern of a semiconductor integrated circuit by changing transistor sizes of transistors in an existing layout pattern, comprising the steps of:

a symbolic layout generation step for generating a symbolic layout by using the existing layout pattern of the semiconductor integrated circuit;

a transistor size optimization step for optimizing a transistor size of each transistor in circuit connection information of the layout pattern;

a correspondence information generation step for generating correspondence information of the transistors in the symbolic layout and the sizes of the transistors whose sizes being changed by using the symbolic layout generated in the symbolic layout generation step and the circuit connection information optimized in the transistor size change step;

a symbol conversion step for converting the transistor symbols in the symbolic layout according to the correspondence information;

a compaction step for compacting the symbolic layout converted in the symbol conversion step;

a new layout pattern generation step for generating a new layout pattern of the semiconductor integrated circuit by using the compacted symbolic layout;

an evaluation step for evaluating whether or not the new layout pattern generated in the new layout pattern generation step satisfies predetermined conditions; and a circuit extraction step for extracting circuit connection information of the new layout pattern when the new layout pattern does not satisfy the predetermined conditions, wherein the transistor size optimization step optimizes the transistor sizes by using the circuit connection information extracted in the circuit extraction step, the symbol conversion step converts the symbol of the symbolic layout compacted in the compaction step in order to generate the new layout pattern of the semiconductor integrated circuit.

8. A layout pattern generation device for generating a new layout pattern of a semiconductor integrated circuit by changing transistor sizes of transistors in an existing layout pattern, comprising:

polygon symbolic converter for converting a layout pattern of the semiconductor integrated circuit to a symbolic layout;

transistor size changer for changing a transistor size of each transistor in circuit connection information of the layout pattern;

correspondence information generator for generating correspondence information of the transistors in the symbolic layout and the sizes of the transistors whose sizes being changed by using the symbolic layout converted by the polygon symbolic conversion means and the circuit connection information changed by the transistor size change means;

symbol converter for converting the transistor symbols in the symbolic layout according to the correspondence information;

compactor for compacting the symbolic layout converted by the symbol conversion means; and symbolic polygon converter for generating a new layout pattern of the semiconductor integrated circuit by using the compacted symbolic layout.

\* \* \* \* \*